(12) United States Patent
Whitworth et al.

(10) Patent No.: US 6,642,550 B1
(45) Date of Patent: Nov. 4, 2003

(54) SILICON SUB-MOUNT CAPABLE OF SINGLE WIRE BONDING AND OF PROVIDING ESD PROTECTION FOR LIGHT EMITTING DIODE DEVICES

(75) Inventors: Adam John Whitworth, Sunnyvale, CA (US); Faraj A. Sherrima, Milpitas, CA (US); Ashok Kumar Chalaka, Milpitas, CA (US)

(73) Assignee: California Micro Devices, Milpitas, CA (US)

( * ) Notice: Subject to any disclaimer, the term of this patent is extended or adjusted under 35 U.S.C. 154(b) by 0 days.

(21) Appl. No.: 10/228,728

(22) Filed: Aug. 26, 2002

(51) Int. Cl.$^7$ ................................................ H01L 33/00
(52) U.S. Cl. .............................. 257/99; 257/100; 257/81
(58) Field of Search ........................... 257/80, 81, 84, 257/99, 100, 355, 676

(56) References Cited

U.S. PATENT DOCUMENTS

2001/0020705 A1 * 9/2001 Miyata ..................... 257/80
2002/0028527 A1 * 3/2002 Maeda et al. ................ 438/29

* cited by examiner

Primary Examiner—Minh Loan Tran
(74) Attorney, Agent, or Firm—James E. Eakin

(57) ABSTRACT

An apparatus consisting of a single wire bond silicon sub-mount used to make an LED device which also has built-in ESD protection in the sub-mount. The single wire bond silicon sub-mount uses a pass-through interconnection between the topside of the sub-mount and the underside so that the LED chip mounted thereon is electrically coupled through the sub-mount to the anode.

15 Claims, 7 Drawing Sheets

SILICON SUB-MOUNT CAPABLE OF SINGLE WIRE BONDING AND OF PROVIDING ESD PROTECTION FOR LIGHT EMITTING DIODE DEVICES

BACKGROUND

1. Field of the Invention

The invention is generally related to LED devices. More particularly, the invention is related to the design of silicon sub-mount LED devices.

2. Related Art

Conventional LED (Light Emitting Diode) devices such as the LED device 100 pictured in FIG. 1 are encapsulated by a clear and/or translucent plastic with two protruding metal contacts. One of these contacts is called the anode while the other is the cathode. The back of the LED die is attached (using conductive solder) to one metal contact while a wire bond is used to complete the electrical circuit therein by attaching to the other metal contact. One disadvantage of this typical LED arrangement is that there is no built-in protection for Electro-Static Discharge (ESD) but is cheap to manufacture.

In recent vogue have been "silicon sub-mount" based LED arrangements. One such arrangement 200 is illustrated in FIG. 2. The sub-mount has a topside to which a vendor's LED chip can be attached. The sub-mount has electrical connectors such as solder bumps which are exposed on its topside. These connectors electrically couple the LED chip's anode and cathode. The sub-mount is placed upon the cathode. The sub-mount, on its underside, has one connection connected to the lead frame. This underside connection cannot be electrically insulated from the lead frame since there is a need to dissipate heat generated by the LED chip. The sub-mount is wire-bonded to the lead-frame by way of two wire bonds, one coupling to the anode, and the other coupling to the cathode. In this arrangement, the silicon sub-mount includes two back-to-back Zener diodes (well-known in the art) which provide ESD protection. The Zener diodes' cathodes connect to the anode and cathode of the lead frame and the Zener diodes' common anodes connect to the underside of the sub-mount. Again, the entire sub-mount and LED chip assembly along with the two wire bonds are encapsulated in a similar fashion to the more conventional LED described above.

The sub-mount LED arrangement 200 of FIG. 2 while providing ESD protection (by way of the Zener diodes) has several disadvantages. Unlike the more conventional LED arrangement shown in FIG. 1, the sub-mount LED requires two wire bonds. This adds to manufacturing costs and can adversely impact reliability. Further, if a voltage is applied in a reverse direction (i.e. reverse to that "forward direction" which would cause the LED to illuminate) there is only a 0.6 voltage drop due to the forward biasing of one of the Zener diodes. If a user connects the LED backwards (i.e. with the opposite polarity) to a low-impedance voltage source, the arrangement will consume a huge amount of current, heat-up and likely burn out.

Other arrangements include a two wire bond LED without silicon sub-mount. This arrangement would suffer from the disadvantage of having an extra wire bond as well as the disadvantage of not having any ESD protection.

There is a need thus for a silicon sub-mount solution that can avoid these difficulties while still featuring built-in ESD protection.

SUMMARY

What is disclosed is an apparatus consisting of a single wire bond silicon sub-mount used to make an LED device and which also has built-in ESD protection in the sub-mount. The single wire bond silicon sub-mount uses a pass-through interconnection between the topside of the sub-mount and the underside so that the LED chip mounted thereon is electrically coupled through the sub-mount to the anode. The single wire bond is used to couple the LED chip via the topside of the sub-mount and through the sub-mount all the way to the cathode. The pass-through interconnection provided by the silicon sub-mount eliminates the need for a second wire bond and enables a single wire bond connection between the lead frame (anode and cathode) and the LED chip. The ESD protection circuitry is by way of two back-to-back series connected Zener diodes.

BRIEF DESCRIPTION OF THE DRAWINGS

These and other objects, features and advantages of the present invention are better understood by reading the following detailed description, taken in conjunction with the accompanying drawings, in which.

DETAILED DESCRIPTION

In brief, the invention consists of an apparatus consisting of a single wire bond capable silicon sub-mount used to make an LED device and includes built-in ESD protection circuitry within the sub-mount itself. The single wire bond capable silicon sub-mount uses a pass-through interconnection between the topside of the sub-mount and the underside so that the LED chip mounted thereon is electrically coupled through the sub-mount to the cathode. The single wire bond is used to couple the LED chip via the topside of the sub-mount to the anode. The pass-through interconnection provided by the silicon sub-mount eliminates the need for a second wire bond and enables a single wire bond connection between the lead frame (the anode portion) and the LED chip. In one embodiment of the invention, the exposed topside surface of the silicon sub-mount has portions which are layered with pure aluminum which adds to the reflectivity of the topside surface of the sub-mount. The improved reflectivity will then add to the luminance provided by the LED chip which is mounted on the silicon sub-mount. In at least one embodiment of the invention, the silicon sub-mount is structured such that it provides ESD protection in both the forward biased and reverse biased directions. The ESD protection circuitry can be implemented by two backto-back Zener diodes that are connected together in series. Further, by changing the resistivity of the substrate upon which the silicon sub-mount is based, a wider and higher range of LED operating voltages can be accommodated by the ESD circuitry.

Figure 1:
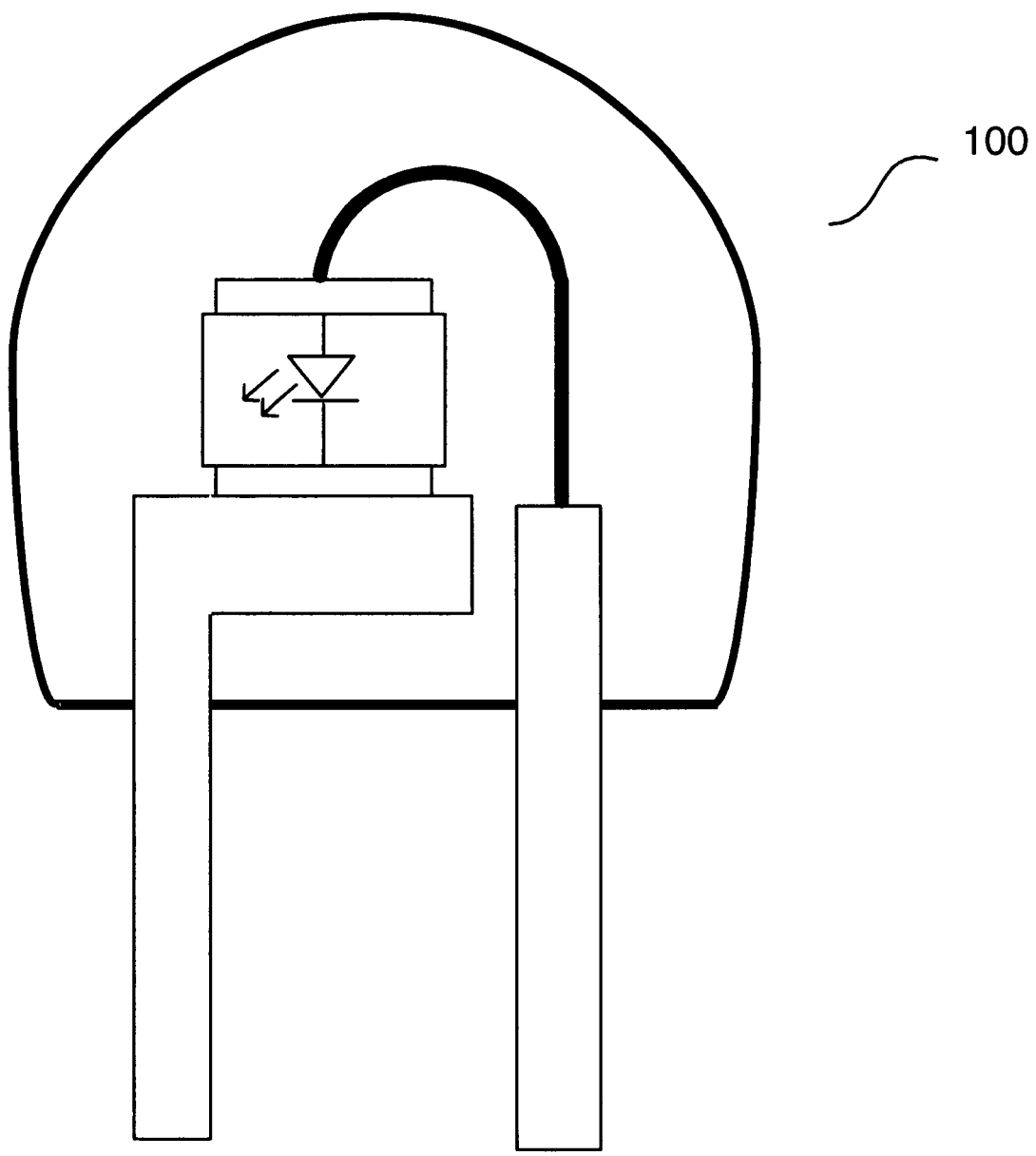
FIG. 1 illustrates a conventional LED arrangement.
Figure 2:
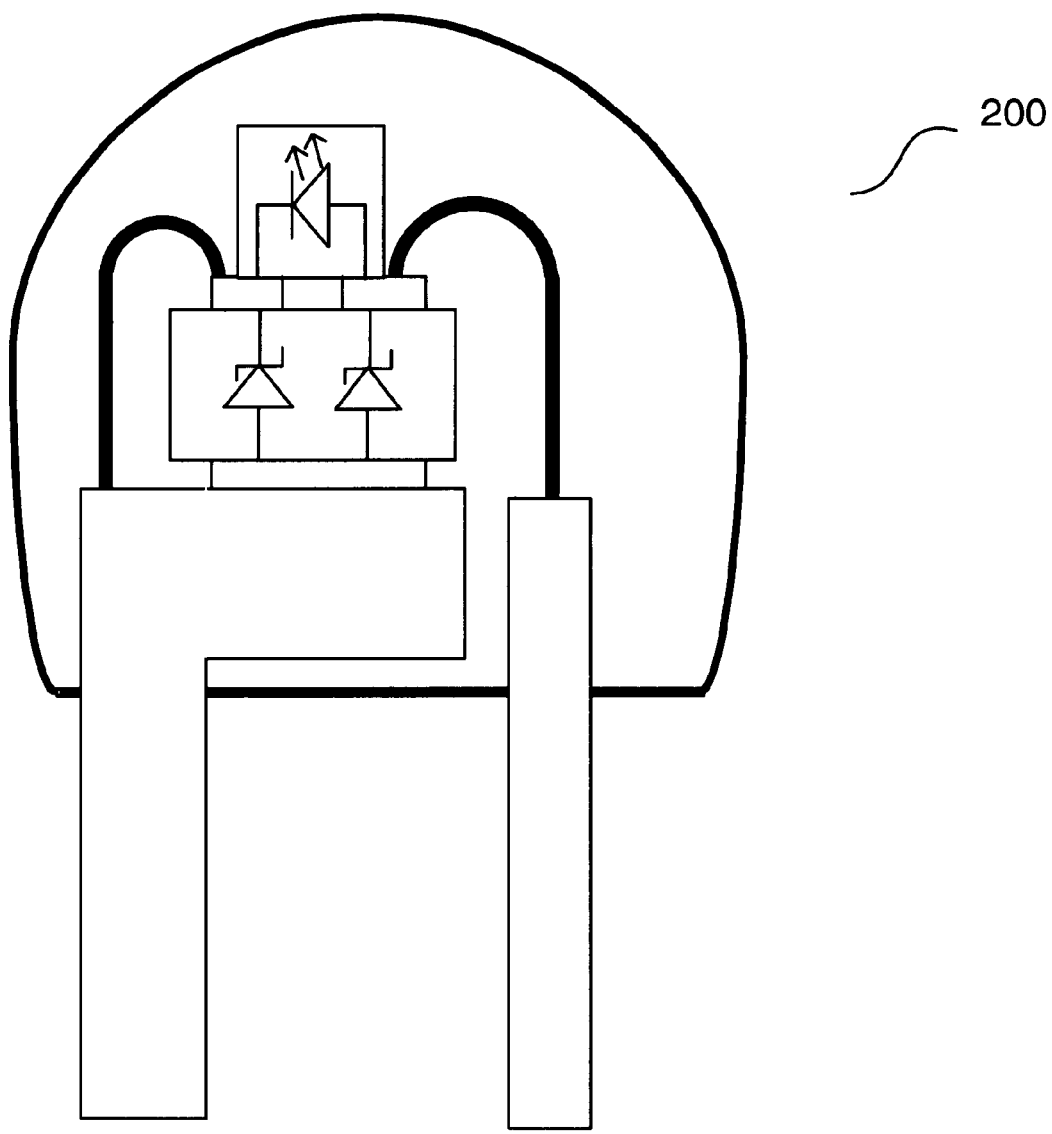
FIG. 2 illustrates a conventional silicon sub-mount LED arrangement.
Figure 3:
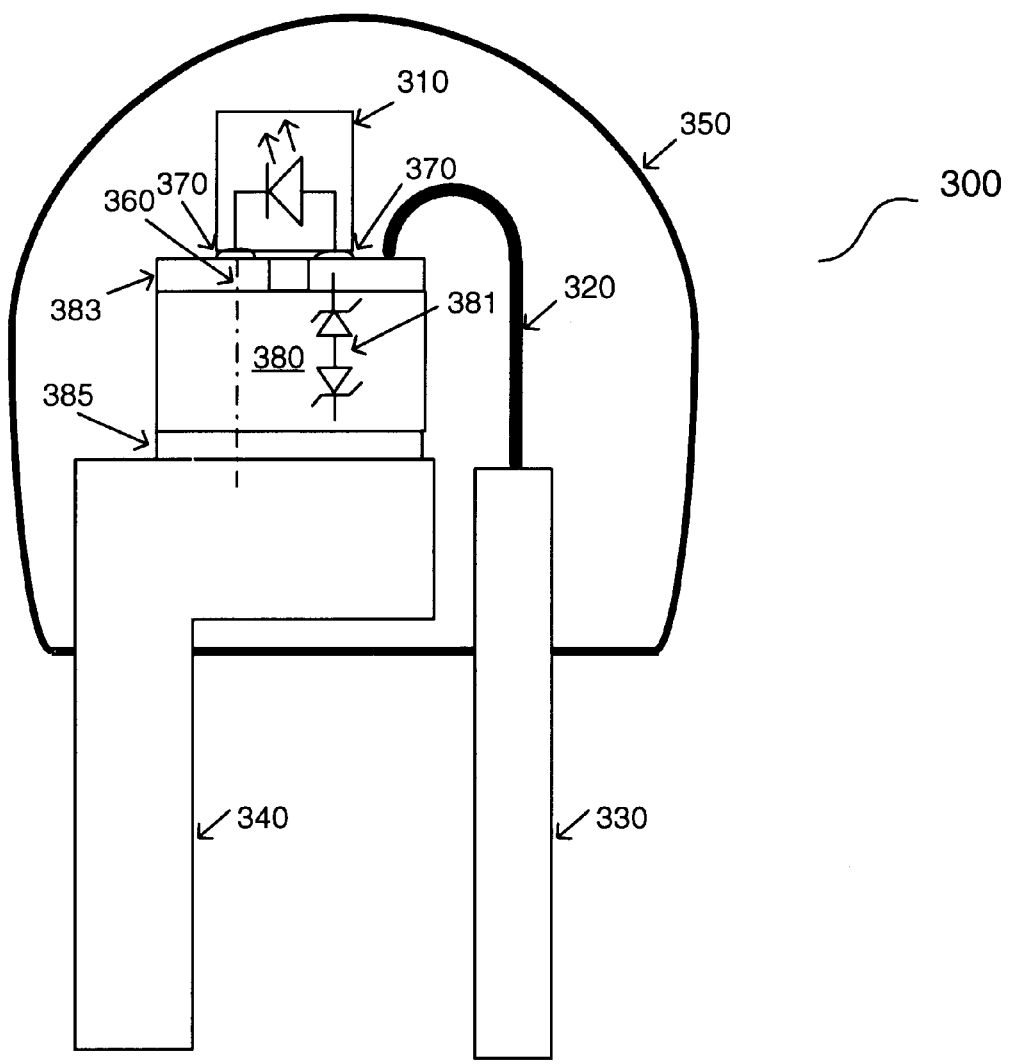
FIG. 3 illustrates a single wire bond silicon sub-mount LED arrangement according to at least one embodiment of the invention.

FIG. 3 illustrates a single wire bond silicon sub-mount LED arrangement according to at least one embodiment of the invention. LED arrangement 300 consists of an LED chip 310 which is encapsulated by a translucent package 350 such as a plastic bulb. Package 350 encloses a part of the lead frame which consists of two separate electrical connectors, namely an anode 330 and a cathode 340. Anode 330 and cathode 340 protrude outside of package 350. LED chip 310 is connected to a single wire-bond capable silicon sub-mount 380 (which is the subject of at least one embodiment of the invention) over solder bumps 370 disposed on the topside of sub-mount 380. LED chip 310 is arranged such that the contact pads of the LED chip align with and connect to the solder bumps 370.

Silicon sub-mount 380 has two functional regions, namely, an upper region 383 and a lower region 385. Upper region 383 is composed of a number of various charged regions as well as ohmic contacts in rough alignment vertically below the area where solder bumps 370 are formed. Upper region 383 is detailed in FIG. 4 and FIG. 7 and described in greater detail below. Lower region 385 is essentially an ohmic contact with an exposed underside layer of conductive material such as gold and an adhesion layer interposing the conductive material and the substrate (see FIG. 4) of the silicon sub-mount 380. Silicon sub-mount 380 is advantageous in that only a single wire bond is needed for LED operation and in that it provides built-in ESD protection in both forward and reverse bias directions.

The single wire bond capability of silicon sub-mount 380 is due in part to its unique structure which includes a pass-through interconnect 360. The pass-through interconnect 360 (shown in dashed lines) electrically couples one part of the topside of sub-mount 380 with the underside of sub-mount 380 in a vertical path which is aligned in the horizontal direction with one of the solder bumps on the topside of the silicon sub-mount 380. The electrical connectivity over the path defined by the pass-through interconnect 360 is facilitated by n+ regions in upper region 383 and in the substrate and the ohmic contact in lower region 385. It allows one terminal of the LED in LED chip 310 to connect to the cathode 340 through the corresponding solder bump 370. The pass-through interconnect 360 is shown on the left side of the silicon sub-mount 380 for purposes of illustration only and may be positioned as desired.

As shown in arrangement 300, the single wire bond 320 is connected from the anode 330 to the topside of silicon sub-mount 380. Current flows, ordinarily horizontally through the upper region 383 and through the solder bump 370 of the right side to the terminal of the LED. The cathode 340 is coupled to the LED chip 310 by way of pass-through interconnect 360 and passes current to the LED chip 310 through the interconnect 360.

The other solder bump (i.e. the one shown o n the right side of the silicon sub-mount 380) is disposed above a vertical path through the silicon sub-mount 380 which contains an ESD protection circuitry 381. The ESD protection circuitry 381 can be modeled as shown as a pair of back-to-back oppositely biased Zener diodes that are connected together in series. The actual structure corresponding to this electrical model is set forth in FIG. 4 and described below. The ESD circuitry 381 operates such that the circuit is off (i.e. passes no current) in the operating voltage range of the LED chip 310. Since the Zener diodes are back-to-back (and connected in series), both voltages in the forward bias direction of the LED (a positive voltage) and the reverse bias direction (a negative voltage) are accommodated. If the voltage across the circuitry 381 falls within that range, the no current passes through 381. In such cases, the flow of current would be from anode 330, over wire bond 320, through upper region 383 and to the LED terminal via the solder bump 370. Whenever the voltage exceeds a particular threshold (see FIG. 6 and accompanying description) in the forward direction or falls below a particular threshold in the reverse direction, the ESD circuitry 381 will conduct and draw current away from LED chip 310, thereby protecting it from an overload condition.

Figure 4:
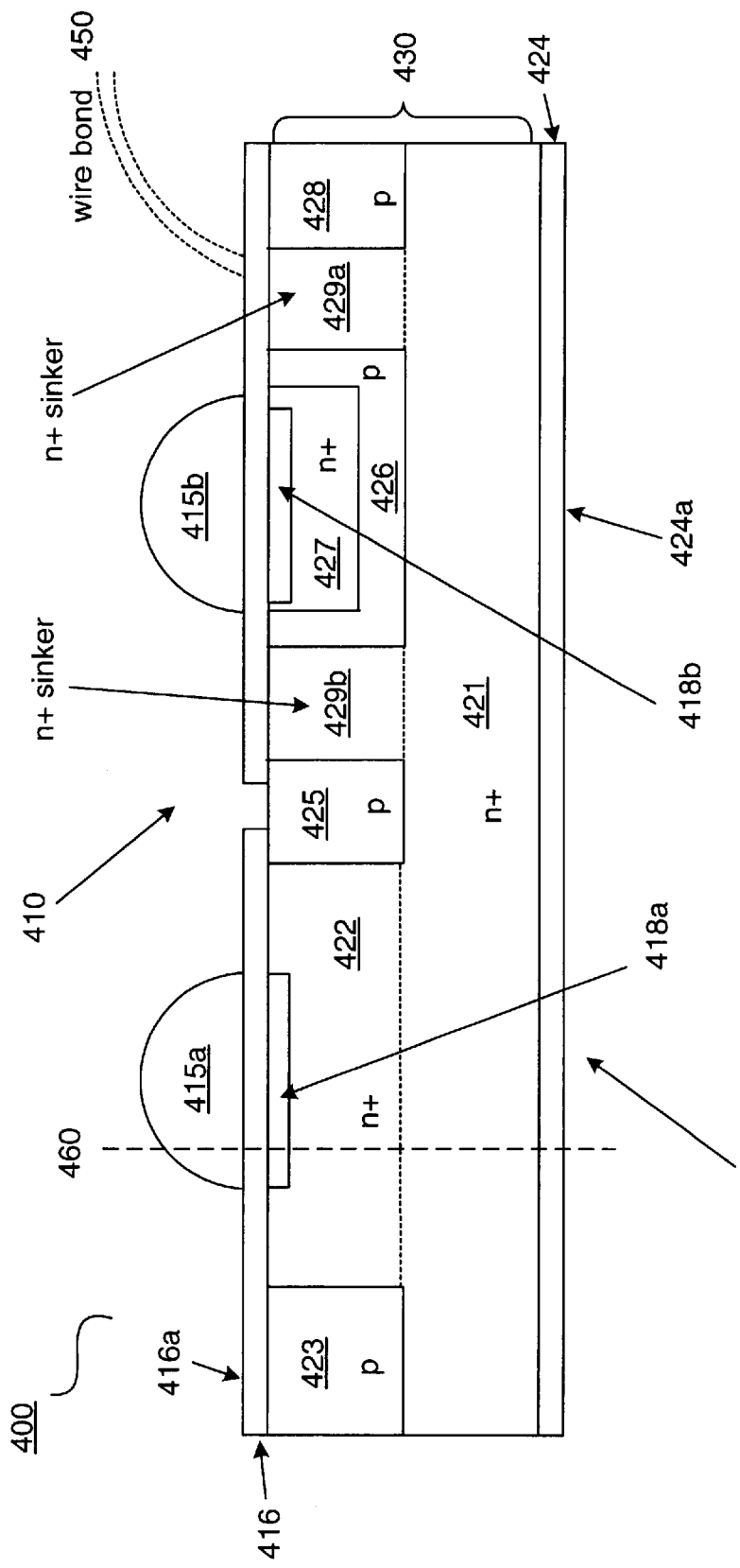
FIG. 4 illustrates a cross-sectional view of the single wire bond capable silicon sub-mount according to at least one embodiment of the invention.

FIG. 4 illustrates a cross-sectional view of the single wire-bond silicon sub-mount according to at least one embodiment of the invention. Silicon sub-mount 400 of FIG. 4 has a topside 410 and an underside 420. Silicon sub-mount 400 is shown as being formed into a silicon-based substrate 430. The topside 410 has at least a pair of solder bumps 415$a$ and 415$b$ disposed over a mirroring interconnect layer 416. Mirroring interconnect layer 416 has an exposed top surface 416$a$ of pure aluminum which helps to provide a mirror-like reflective plane to the topside 410. The top surface 416$a$ adds to the overall luminance provided by the LED arrangement in which the sub-mount 400 will be used. The remaining portion of interconnect layer 416 is a composite of aluminum and other elements such as silicon and copper. The composite provides the needed stable electrical contact that the pure aluminum in the top layer does not.

Figure 7:
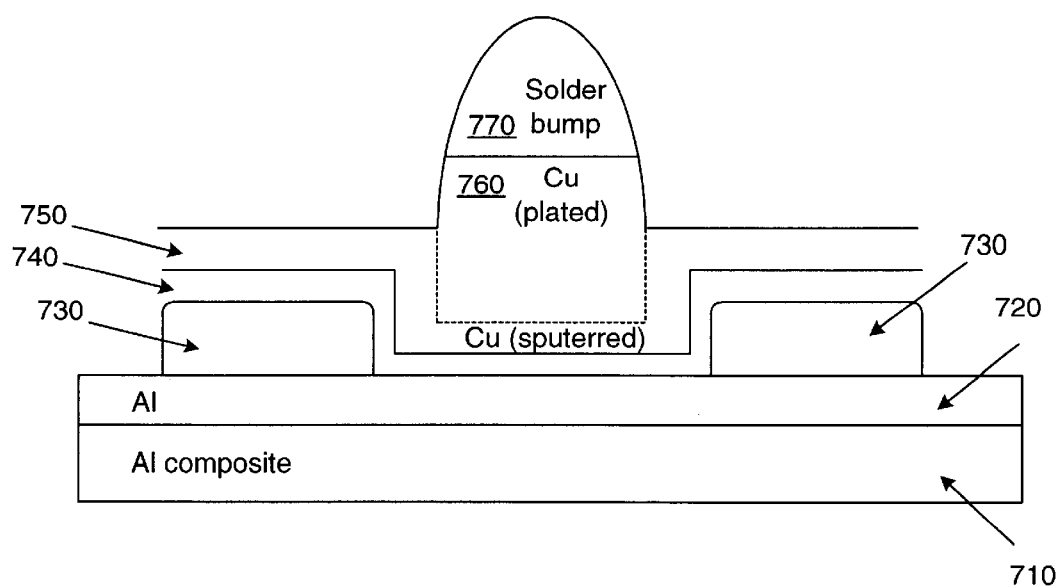
FIG. 7 illustrates a detailed view of the topside surface of the silicon sub-mount about the solder bumps.

Solder bumps 415$a$ and 415$b$, for instance composed of lead-free composite material, are disposed over interconnect layer 416. Layers of copper and nickel (or nickel composite) (shown in FIG. 7) may interpose the pure aluminum 416$a$ surface of interconnect layer 416 and solder bumps 415. A detailed view of the region between solder bumps 415$a$ and 415$b$ and the interconnect layer 416 is shown in FIG. 7 and described in the accompanying text below. Ohmic contacts 418$a$ and 418$b$ are formed into the silicon substrate 430 below the interconnect layer 416. Ohmic contacts 418$a$ and 418$b$ may have a width approximately matching the width and horizontal placement of solder bumps 415$a$ and 415$b$, respectively. Ohmic contacts 418$a$ and 418$b$ may be formed by diffusion or other processes as described below.

Each of the ohmic contacts 418$a$ and 418$b$ is surrounded in substrate 430 by n+ regions 422 and 427, respectively. The n+ region 422 surrounds its corresponding ohmic contact 418$a$ on all three sides. Likewise, n+ region 427 surrounds its corresponding ohmic contact 418$b$ on all three sides. The n+ region 422 has an underside adjacent to an n+ region 421, a left side adjacent to a p region 423 and a right side adjacent to a separate p region 425. The n+ region 427 is enclosed on three sides (left, right and underside) by a single p region 426. The right side of p region 426 and p region 428 are separated by n+ sinker 429$a$. The left side of p region 426 is adjacent to an n+ sinker 429$b$. The underside of p region 426 is adjacent to n+ region 421.

The underside 420 of silicon sub-mount 400 has an ohmic contact 424. Ohmic contact 424 is composed of a conductive material of such as copper, gold or a composite. The ohmic contact 424 has an exposed underside surface 424$a$ which is made of pure gold or pure conductive material as well as an adhesion layer which interposes the n+ region 421 and the surface 424$a$. The adhesion layer assists in bonding the conductive material of ohmic contact 424$a$ to the n+ region 421 and may be composed for instance of titanium or a composite.

The electrical operation of the silicon sub-mount 400 is as follows. The n+ sinker 422 and n+ region 421 are contiguous and form a "pass-through" electrical interconnect. The pass-through interconnect 460 has a path defined from solder bump 415a, through mirroring interconnect layer 416 and ohmic contact 418a, and into n+ sinker 422 and n+ region 421 finally terminating at ohmic contact 424. Thus, the pass-through interconnect 460 electrically couples the topside 410 to the underside 420 passing current along the path defined thereby. This allows the lead frame cathode upon which the silicon sub-mount 400 would sit when assembled to be connected electrically through to the solder bump 415a and consequently, to that terminal of the LED chip connected at solder bump 415a. The conduction at the surface 416a of mirroring interconnect layer 416 directly below solder bump 415a can be evidenced by reference to FIG. 7.

As discussed in FIG. 3, the silicon sub-mount 300 has an ESD protection circuitry 381 modeled as a pair of back-to-back oppositely biased Zener diodes. This corresponds to the following structure in silicon sub-mount 400. A first p-n junction is defined by the junction between n+ sinker 427 and the p region 426. This first junction can be modeled as a Zener diode biased in the direction from p region 426 to n+ sinker 427. Likewise, a second p-n junction is defined by the junction between p region 426 and n+ region 421. This second junction can be modeled as a Zener diode biased in the direction from p region 426 to n+ sinker 421. Hence, the diode modeled by the first p-n junction and the diode modeled by the second p-n junction are back-to-back but in oppositely biased directions.

A wire bond 450 can be connected to the silicon sub-mount 400 such that current flows from the wirebond then horizontally along the conductive surface to bump 415b and then into the LED chip.

Figure 5:
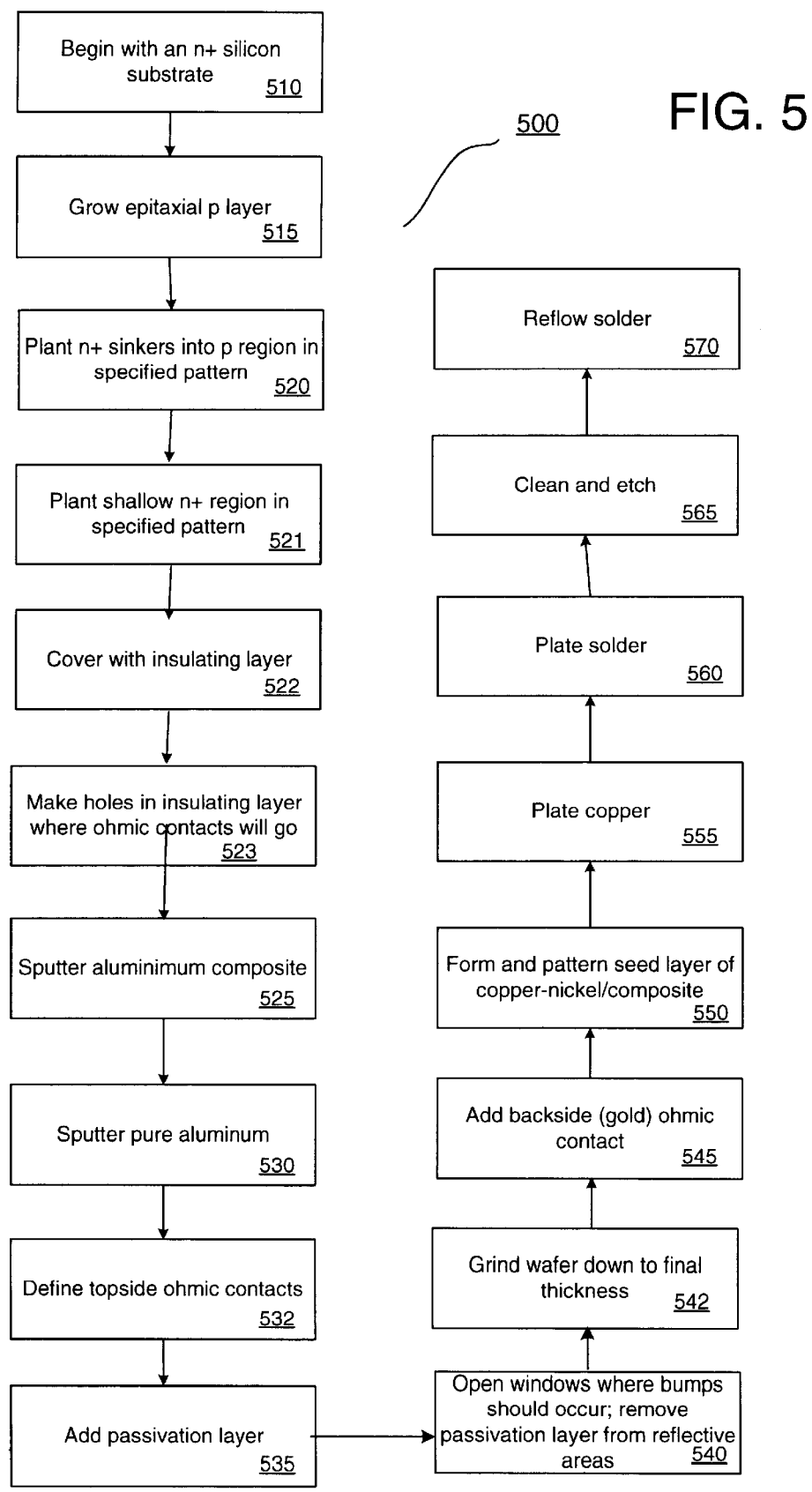
FIG. 5 is a flow diagram illustrating the process of forming a silicon sub-mount capable of single wire bond mounting according to at least one embodiment of the invention.

FIG. 5 is a flow diagram illustrating the process of forming a silicon sub-mount capable of single wire-bond mounting according to at least one embodiment of the invention. The silicon sub-mount described above can be formed from a p-active process 500 as shown. The process 500 begins with an n+ silicon substrate (step 510) of a given concentration. Then, by suitable processes, an epitaxial p layer is grown on topside surface of the n+ substrate (step 515). The p layer covers the entire width and depth of the surface of the n+ substrate. Next, n+ sinkers are planted in a specified pattern (step 520). For instance, one such pattern is shown in FIG. 4 above, two n+ sinkers 429a and 429b are planted (according to step 520) about the periphery of region where the ohmic contact 418b subsists such they become immediately adjacent to the original n+ substrate. Likewise, n+ region 427 is planted into the p region in the region where the ohmic contact 418b will subsist. Similarly, n+ sinker 422 is planted such that the p region below it is completely eliminated. There may also be an additional field boost (added to process 500) in those p regions remaining after the n+ sinkers are planted. After sinkers are planted then plant shallow n+ regions (step 521). Then the sub-mount is covered on top with an insulating layer (step 522). Holes in the insulating layer are then made where the ohmic contacts are to be positioned (step 523).

Once the n+ regions are formed, then an aluminum composite, such as aluminum-silicon-copper, are sputtered (step 525). The composite improves the presence of any micro-cracks. Next, a pure layer of aluminum is sputtered above the composite layer (step 530). This adds reflectivity to the surface of the silicon sub-mount such that light emitted from the LED, when mounted and in operation, will reflect off the surface of the silicon sub-mount and thus add to the overall luminance of the LED arrangement in which it will be used. The topside ohmic contacts are then defined before the aluminum is sputter using, for example, a photolithography process (step 532) which is described below.

After the surface of the silicon sub-mount is defined, a passivation layer (for instance of silicon nitride) is added (step 535). Windows in the passivation layer are opened in the location where the solder bumps will eventually be formed (step 540). Concurrently, the passivation layer is removed from any areas of the surface that are to be used for their reflectivity (also step 540) (i.e. areas where the LED die, solder bumps do not cover). At this stage, the sub-mount is lapped (ground) down to the final thickness (step 542). This thinning down of the sub-mount will improve the thermal conductivity of the sub-mount. Then the underside ohmic contact is added (step 545). The underside ohmic contact can be formed as follows.

The ohmic contact should be formed such that the sub-mount is capable of electrically connecting to the lead frame cathode. The ohmic contact is formed by way of plating the underside of the silicon sub-mount with gold or other conductive material. An adhesion layer may interpose between the gold plating and silicon substrate in order to facilitate physical/chemical bonding of the two. Such an adhesion layer may consist of titanium, for instance. In all subsequent steps, the backside of the sub-mount is covered with a layer of photoresist to protect the gold and prevent lateral conduction during the plating process. The processing of the underside should be such that there is no physical/chemical stress to the silicon substrate.

Going then back to the processing of the topside, a seed layer of copper and a nickel composite is formed (step 550). This seed layer is needed in order to make the plating process possible as is explained below. Using standard photolithography techniques, the topside of the sub-mount is patterned. Windows where the copper and solder are to be plated are kept clear of photoresist while other areas are covered with photoresist. This will allow the deposition of ions to be confined only to these windows.

When plating, the sub-mount is electrically connected to a plating rack that is immersed in an electrolytic solution and thus, current will flow from the anode to the plating rack through the seed layer and then to the electrolytic solution and finally to the cathode. As indicated in FIG. 7, copper layer 760 is plated (step 555) to the desired thickness before the sub-mount is moved to plate the solder. This copper layer will form the wetting ground for the solder and will act also as a barrier to prevent diffusion of the solder into the aluminum layers underneath. Solder is then plated (step 560) to the desired height. After removing the photoresist, the seed layer is etched out from the field followed by a cleaning step (step 565). The solder then goes through a reflow step that will allow it to take final shape (such as when the bumps need to be round) (step 570).

Also, an example of some other characteristics of process 500 is as follows:
1) the substrate is n-type, '100' crystal orientation, doped with antimony in the range of 8 to 20 milliohm-centimeters;
2) the epitaxial layer is 6.2+/−0.2 micrometers thick, and is p-type doped with boron to 1.5+/−0.2 ohm-cm;
3) the sinkers are n-type doped with phosphorous to a concentration of about $10^{20}$ per $cm^3$;
4) optional field boost to p regions of p-type boron to a concentration of $10^{14}$ per $cm^3$; and
5) the shallow n+ layer can have a concentration of $10^{20}$ per $cm^3$ n-type, using phosphorous and with a depth of about 2 micrometers.

Figure 6:
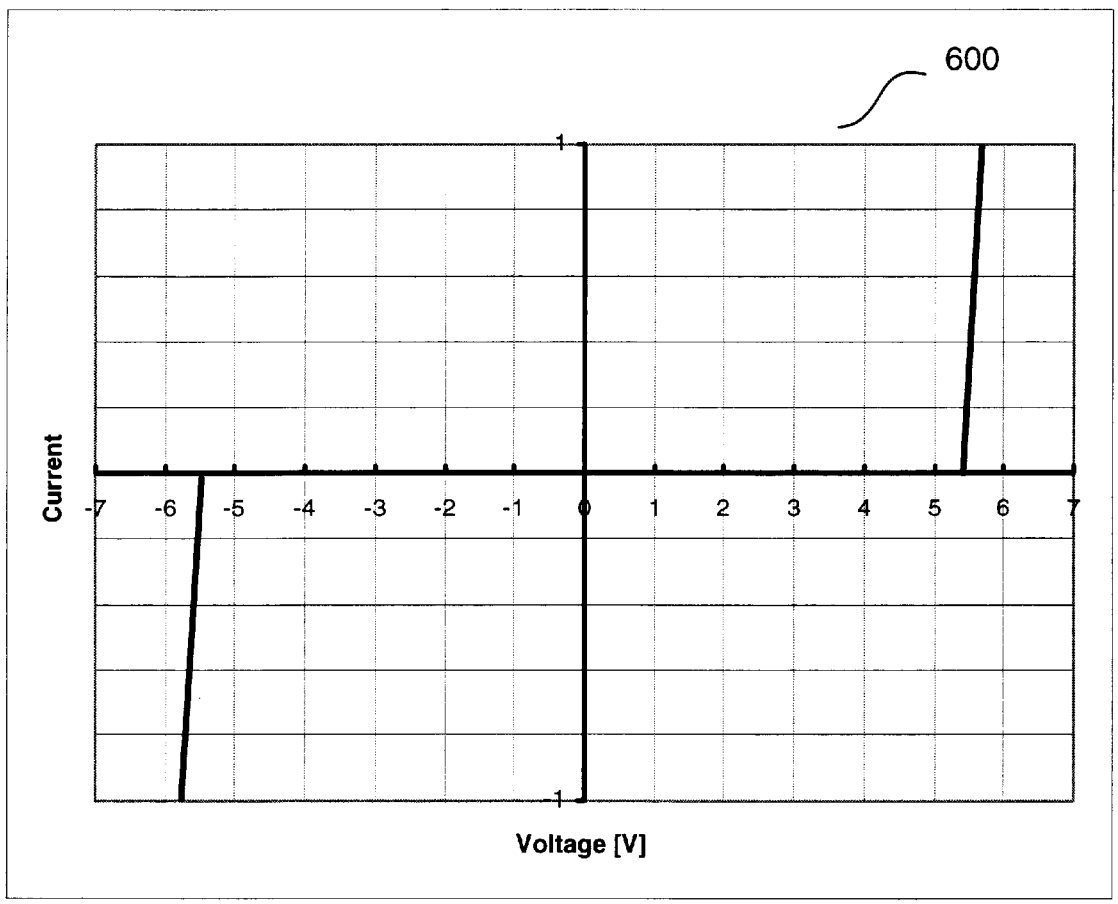
FIG. 6 illustrates the I-V characteristics of the ESD protection in at least one embodiment of the invention.

FIG. 6 illustrates the I–V characteristics of the ESD protection in at least one embodiment of the invention. As described above, the ESD protection circuitry consists of a series of back-to-back diodes connected in parallel with the LED chip. Thus, any current flowing through the ESD circuitry may reduce the efficiency of the LED. Ordinarily, the LED chip being mounted has approximately 4 volts across it when lit up. To allow for a large tolerance in the operating voltage range for different LEDs, a margin of over 1.0 volts is provided. Therefore, in one embodiment of the invention, to allow for this margin, the ESD protection provided by the silicon sub-mount is clamped at +/−5.5 volts, approximately. Up to this voltage (5.5 volts), the ESD protection circuitry must be off (i.e. there must not be any current flowing through it). Below approximately 5.5 volts in the reverse biased direction and above approximately 5.5 volts in the forward direction, the current increases as rapidly as possible (as illustrated the curve is nearly vertical above approximately 5.5 volts and below approximately −5.5 volts). The current is close to zero through the protection circuitry where the voltage is between +5.5 volts and −5.5 volts.

In other embodiments of the invention, even higher LED operating voltages, for instance +/−7.5 volts can be supported by the ESD protection circuitry. In still other embodiments, depending upon the application the sub-mount will be used in, the ESD protection circuitry provided therein can be adapted to service any operating voltage range desired. For instance, the substrate itself used in forming the silicon sub-mount can be given a higher resistivity, and thus be able to withstand more voltage before breaking down and passing current.

FIG. 7 illustrates a detailed view of the topside surface of the silicon sub-mount about the solder bumps. First, there is an aluminum composite layer 710 which may be composed of aluminum, silicon and copper, for instance. A pure layer 720 of just aluminum is deposited immediately above the aluminum composite layer 710. As shown, this pure aluminum layer 720 is exposed on the topside of the silicon sub-mount in regions not covered by the solder bumps and accompanying UBM (under-bump metallization) layers. The UBM is formed using a passivation layer of, for instance, silicon nitride ($Si_3N_4$) (step 535 of FIG. 5). The passivation layer is removed where the solder bumps will occur and removed wherever the pure aluminum layer is to be exposed at the topside surface (step 540 of FIG. 5). The remaining passivation layer 730 is shown in FIG. 7.

The UBM as its first layer has a nickel or nickel composite layer 740. This nickel/nickel composite layer 740 can be formed by a sputtering technique. A first copper layer 750 is then sputtered over the nickel/nickel composite layer 740. This layer will act as a barrier layer to prevent the solder from diffusing down to the aluminum layers. After sputtering a copper layer 750 a thicker copper layer 760 is plated in areas under the bump defined by photolithography. Then, finally, the solder bump 770 is deposited over the copper plated layer 760.

As one example, the relative scale in size of these layers may be as follows:

Nickel/nickel composite: 0.5 microns;
Sputtered copper layer: 0.8–1.0 microns;
Plated copper layer: 2–8 microns;
Solder bumps: 20–150 microns ( a wide range depending upon intended application);
Aluminum composite: 1.5 microns.

The solder bump 770 itself may be round or oval or any suitable shape (when viewed from the topside of the silicon sub-mount on which it is deposited) depending upon the application in which the silicon sub-mount will be used.

While the above embodiments refer to a 'silicon' sub-mount, this term is not intended to be limiting in any manner as any material which has properties or can function in the role of a substrate may be used. Further, while a p-active process over a n-type substrate has been described, one of ordinary skill in the art could also adapt the above described embodiments in an n-active process over a p-type substrate if so desired. Also, while one method of forming and the structure involved in a pass-through interconnect has been described, the above is not intended to be limiting.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

What is claimed is:

1. A system for enabling illumination, said system connecting to a lead frame having an anode and cathode, said system comprising:

a light emitting diode device having a first and second terminal; and a semiconductor based sub-mount for mounting said LED device thereon, said sub-mount having a topside and an underside, said sub-mount including a pass-through interconnect electrically coupling said topside with said underside through said sub-mount, said pass-through interconnect further electrically coupling said second terminal of said light emitting diode device with said cathode when said second terminal is connected to said topside, said pass-through interconnect formed by contiguous n regions, further wherein said first terminal of the light emitting diode device is connectable to said anode via a single wire bond, said wire bond connected to said topside, said sub-mount further including an electro-static discharge protection circuitry extending from said topside, said protection circuitry coupled to said topside in the region where said first terminal is connectable.

2. A system according to claim 1 where said topside has an exposed surface composed of a reflective material, said exposed surface increasing luminance made available during operation of said light emitting diode device.

3. A system according to claim 1 wherein said electro-static discharge protection circuitry can be modeled as a pair of series-connected back-to-back Zener diodes connected in series with said first terminal.

4. A system according to claim 3 wherein each said Zener diode is defined by a p to n junction within said sub-mount.

5. A system according to claim 1 wherein said sub-mount further comprises ohmic contacts disposed under said topside, each ohmic contact electrically connecting a region of said sub-mount apparatus with said topside.

6. A system according to claim 1 wherein said topside includes a plurality of solder bumps, said terminals of said light emitting diode device and said topside connectable using said bumps.

7. A semiconductor sub-mount apparatus for mounting a light emitting diode device to a lead frame, said device having a first and second terminal, said lead frame consisting of an anode and a cathode, said sub-mount apparatus mountable entirely upon said cathode, comprising:

a topside upon which said first and second terminals of said light emitting diode device are connectable, said first terminal of the light emitting diode device connectable to said anode via a single wire bond, said wire bond connected to said topside;

an underside having an exposed surface of conductive material, said underside disposed upon and coupling to said cathode;

electro-static discharge protection circuitry extending from said topside, said protection circuitry coupled to said topside in the region where said first terminal is connectable; and a pass-through interconnect electrically coupling said topside with said underside through said sub-mount, said pass-through interconnect further electrically coupling said second terminal of said light emitting diode device with said cathode when said second terminal is connected to said topside, wherein said pass-through interconnect is formed by contiguous n regions.

8. A sub-mount apparatus according to claim 7 where said topside has an exposed surface composed of a reflective material, said exposed surface increasing luminance made available during operation of said light emitting diode device.

9. A sub-mount apparatus according to claim 8 wherein said reflective material is pure aluminum.

10. A sub-mount apparatus according to claim 7 wherein said conductive material is gold.

11. A sub-mount apparatus according to claim 7 wherein said electrostatic discharge protection circuitry can be modeled as a pair of series-connected back-to-back Zener diodes connected in series with said first terminal.

12. A sub-mount apparatus according to claim 11 wherein each said Zener diode is defined by a p to n junction within said sub-mount.

13. A sub-mount apparatus according to claim 7 further comprising:

ohmic contacts disposed under said topside; each ohmic contact electrically connecting a region of said sub-mount apparatus with said topside.

14. A sub-mount apparatus according to claim 7 wherein said topside includes a plurality of solder bumps, said terminals of said light emitting diode device and said topside connectable using said bumps.

15. A semiconductor sub-mount apparatus for mounting a light emitting diode device to a lead frame, said device having a first and second terminal, said lead frame consisting of an anode and a cathode, said sub-mount apparatus mountable entirely upon said cathode, comprising:

a topside upon which said first and second terminals of said light emitting diode device are connectable, said first terminal of the light emitting diode device connectable to said anode via a single wire bond, said wire bond connected to said topside;

an underside having an exposed surface of conductive material, said underside disposed upon and coupling to said cathode;

electro-static discharge protection circuitry extending from said topside, said protection circuitry coupled to said topside in the region where said first terminal is connectable; and a pass-through interconnect electrically coupling said topside with said underside through said sub-mount, said pass-through interconnect further electrically coupling said second terminal of said light emitting diode device with said cathode when said second terminal is connected to said topside, wherein said pass-through interconnect is formed by contiguous p regions.

* * * * *